(12) United States Patent
Kumai et al.

(10) Patent No.: US 7,418,286 B2
(45) Date of Patent: Aug. 26, 2008

(54) MAGNETIC RESONANCE IMAGING APPARATUS AND MAGNETIC RESONANCE IMAGING METHOD

(75) Inventors: Hideki Kumai, Kashiwa (JP); Hiroyuki Takeuchi, Kashiwa (JP)

(73) Assignee: Hitachi Medical Corporation, Tokyo (JP)

( * ) Notice: Subject to any disclaimer, the term of this patent is extended or adjusted under 35 U.S.C. 154(b) by 328 days.

(21) Appl. No.: 10/492,640

(22) PCT Filed: Oct. 15, 2002

(86) PCT No.: PCT/JP02/10662

§ 371 (c)(1),
(2), (4) Date: Apr. 14, 2004

(87) PCT Pub. No.: WO03/032830

PCT Pub. Date: Apr. 24, 2003

(65) Prior Publication Data

US 2004/0245986 A1    Dec. 9, 2004

(30) Foreign Application Priority Data

Oct. 15, 2001    (JP) .............................. 2001-317262

(51) Int. Cl.
*A61B 5/05* (2006.01)
(52) U.S. Cl. ...................... 600/410; 600/407
(58) Field of Classification Search ................. 600/407, 600/410; 324/307, 309
See application file for complete search history.

(56) References Cited

U.S. PATENT DOCUMENTS

| | | | | |
|---|---|---|---|---|
| 4,689,568 A | * | 8/1987 | Matsui et al. ............... | 324/309 |
| 4,780,675 A | * | 10/1988 | DeMeester et al. .......... | 324/312 |
| 5,647,362 A | * | 7/1997 | Fuderer et al. .............. | 600/410 |
| 5,742,163 A | * | 4/1998 | Liu et al. ..................... | 324/309 |
| 5,942,897 A | | 8/1999 | Kanazawa | |

(Continued)

FOREIGN PATENT DOCUMENTS

JP       09-276243       10/1997

(Continued)

OTHER PUBLICATIONS

"Simultaneous Correction of Ghost and Geometric Distortion Artifacts in EPI Using a Multiecho Reference Scan" Vincent J. Schmithorst et al., IEEE Transactions on Medical Imaging, vol. 20, No. 6, Jun. 2001, pp. 535-539.

*Primary Examiner*—Brian L. Casler
*Assistant Examiner*—James Kish
(74) *Attorney, Agent, or Firm*—Cooper & Dunham, LLP

(57) ABSTRACT

In a magnetic resonance imaging apparatus, in order to suppress generation of artifacts when a linear or non-linear phase error is generated during sampling of the echo signals, a first sequence for acquiring a plurality of echo signals by radiating a radio-frequency magnetic field pulse to an object to be examined, performing phase encoding, while alternating the polarity of a readout gradient magnetic field, and a second sequence for acquiring a plurality of echo signals by repeatedly applying the readout gradient magnetic field while reversing its polarity to that in the first sequence at the same phase encoding direction are performed. Signal processing means performs complex addition of the echo signals having the same phase encoding amount respectively obtained in the first sequence and the second sequence, and reconstructs an image.

11 Claims, 10 Drawing Sheets

U.S. PATENT DOCUMENTS

| | | | |
|---|---|---|---|
| 6,172,502 B1 * | 1/2001 | Groen et al. | 324/307 |
| 6,242,914 B1 | 6/2001 | Yoshitome | |
| 6,249,595 B1 * | 6/2001 | Foxall et al. | 382/128 |
| 6,259,250 B1 * | 7/2001 | Mock | 324/309 |
| 6,841,998 B1 * | 1/2005 | Griswold | 324/309 |
| 2001/0008376 A1 * | 7/2001 | Mock | 324/307 |

FOREIGN PATENT DOCUMENTS

| | | |
|---|---|---|
| JP | 11-290287 | 10/1999 |
| JP | 11-512957 | 11/1999 |

* cited by examiner

MAGNETIC RESONANCE IMAGING APPARATUS AND MAGNETIC RESONANCE IMAGING METHOD

TECHNICAL FIELD

The present invention relates to a magnetic resonance imaging apparatus, more particularly to a technique of suppressing appearance of an artifact generated due to phase change among echo signals.

BACKGROUND OF THE INVENTION

A magnetic resonance imaging apparatus (hereinafter referred to as MRI apparatus) is an apparatus which helps medical diagnosis by radiating a radio-frequency magnetic field pulse to a living body while a uniform static magnetic field is operated, exciting atomic nuclei of hydrogen, phosphorous, or the like in the living body, measuring a nuclear magnetic resonance signal (NMR signal) generated due to the excitation, and imaging a region measured in the living body on the basis of magnetic resonance information such as density distribution and relaxation time distribution of hydrogen or phosphorous.

A large number of methods are applicable to MRI apparatuses in measuring echo signals (NMR signal) as typified by the Spin echo method and the Gradient Echo method. Rapid imaging methods is one of these methods. The method is provided to measure a plurality of echo signals by repeatedly alternating the polarity of a gradient magnetic field in the readout direction after radiating the radio-frequency pulse. For example, the single-shot EPI (Echo Planer Imaging) method, the multi-shot EPI method, and the Gradient and Spin Echo Imaging method are included.

However, with those imaging methods, phase errors of measured echo signals are generated because of not only non-uniformity of the static magnetic field, but also eddy current generated due to rapid alternation of the polarity of the readout gradient magnetic field, and imperfections of the readout gradient magnetic field are generated. Because the polarity of the readout gradient magnetic field is alternately inverted, among all echo signals measured those measured in odd-numbered time (hereinafter referred to as "odd echo") and those measured in even-numbered time (hereinafter referred to as "even echo") make opposite trajectories of echo signal collection in the measured space, i.e., the k space, and the polarity of phase error is also alternated in the readout direction.

When phase difference occurs between the odd echo and the even echo as above, in a reconstructed image an artifact described as a N/2 ghost (hereinafter referred to as "N/2 artifact") is generated. A method of removing the N/2 artifact with signal processing has been proposed, utilizing the fact that the phase error included in the echo signals mainly becomes phase gradient in the readout direction in a real image. This method is designed to acquire data for correction in advance and correct the echo signals in actual measurement for forming an image with the correction data.

As means for this correction, for example, a method is disclosed in Japanese Unexamined Patent Publication. Sho. 8-215174, in which the actual measurement data is corrected by calculating phase difference among echo signals after acquiring as correction data one pair of even echo and odd echo and Fourier-transforming those echo signals. Furthermore, a method is described in Japanese Unexamined Patent Publication. Hei. 5-68674, in which correction data is acquired prior to the actual measurement not applying a phase-encoding gradient magnetic field, the one-dimensional Fourier transformation in the readout direction is performed respectively on this correction data and the actual measurement data, and the phase of the correction data is subtracted from the actual measurement data. Besides, there is a method in which phase difference between an odd echo and an even echo is calculated by using data acquired in two measurements where the polarity of the readout gradient magnetic field is alternated, and thus, the phase error between the odd echo and the even echo in the actual measurement is corrected ("Single-Shot and Segmented EPI Ghost Artifacts Removal with Two-Dimensional Phase Correct"; Nan-kuei Chen, Alice M. Wyrwicz; Proceeding of International Society for Magnetic Resonance in Medicine, 8, 1713 (2000)).

As in the conventional correction method described above, correction of the phase gradient in the readout direction in a real image leads to application of an identical phase correction amount to all pixels in the readout direction in the k space. Accordingly, when a linear or non-linear phase error is generated during sampling of echo signals due to eddy current or imperfections of the gradient magnetic field in the readout direction, the phase error cannot be resolved with the same correction amount and an N/2 artifact is generated. Therefore, generation of artifact in image reconstruction cannot be suppressed.

SUMMARY OF THE INVENTION

A first sequence and a second sequence are executed, the first sequence of acquiring a plurality of echo signals by, after radiating a radio-frequency magnetic field pulse to an object to be examined, applying phase encoding and repeatedly applying a readout gradient magnetic field while alternating its polarity, and the second sequence of acquiring a plurality of echo signals by, after radiating a radio-frequency pulse to the object, applying phase encoding and repeatedly applying a readout gradient magnetic field while its polarity is alternated oppositely to that in the first sequence at the same phase encoding amount as the first sequence, wherein signal processing means performs complex addition of the echo signals of the same phase encoding amount respectively obtained in the first sequence and the second sequence to perform image reconstruction.

The object of the present invention is to suppress generation of artifacts to be generated when a linear or non-linear phase error occurs during sampling of echo signals.

BEST MODE FOR CARRYING OUT THE INVENTION

Figure 1:
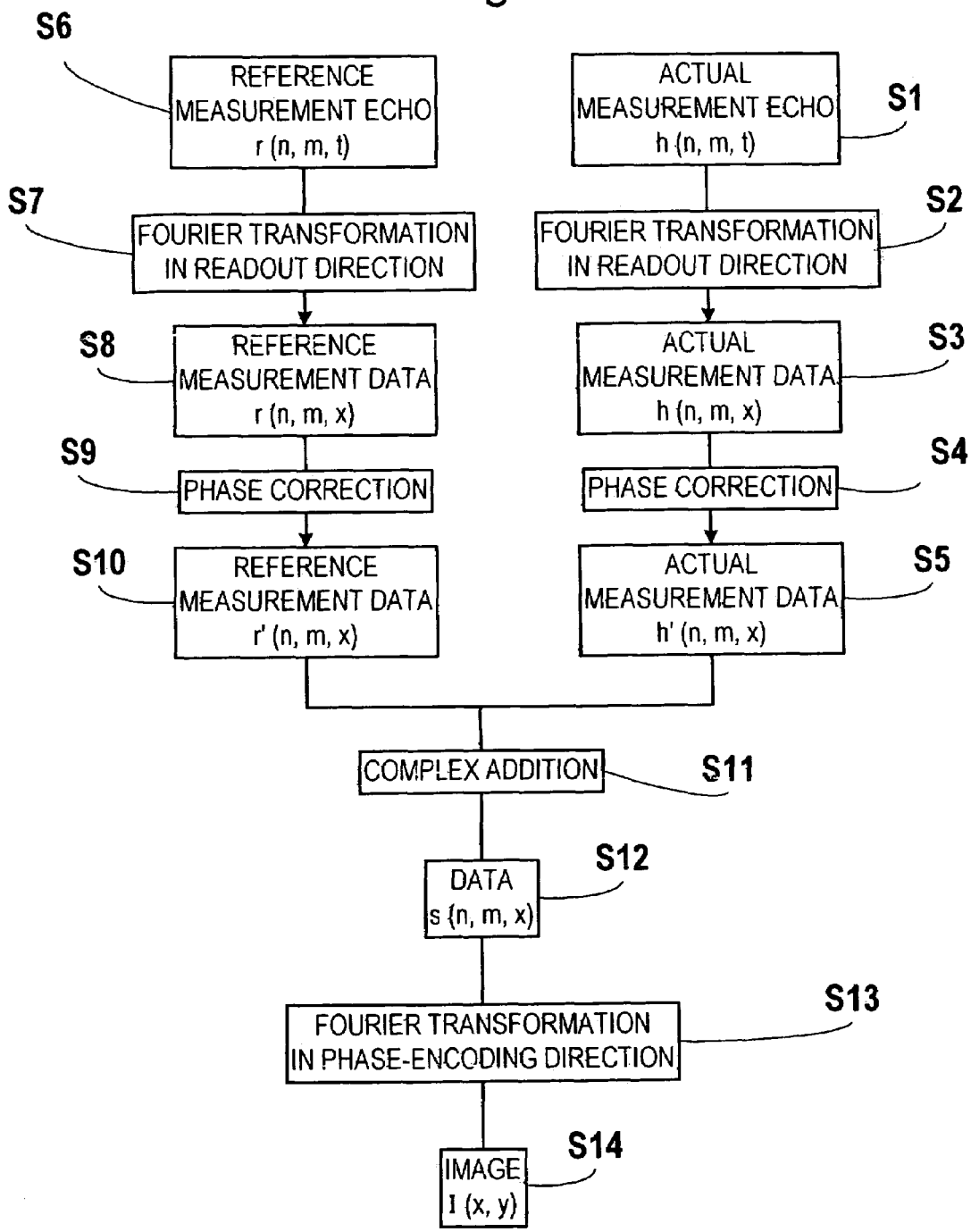
FIG. 1 is a diagram showing the first example of the procedure of signal processing according to the first embodiment of the present invention.
Figure 3:
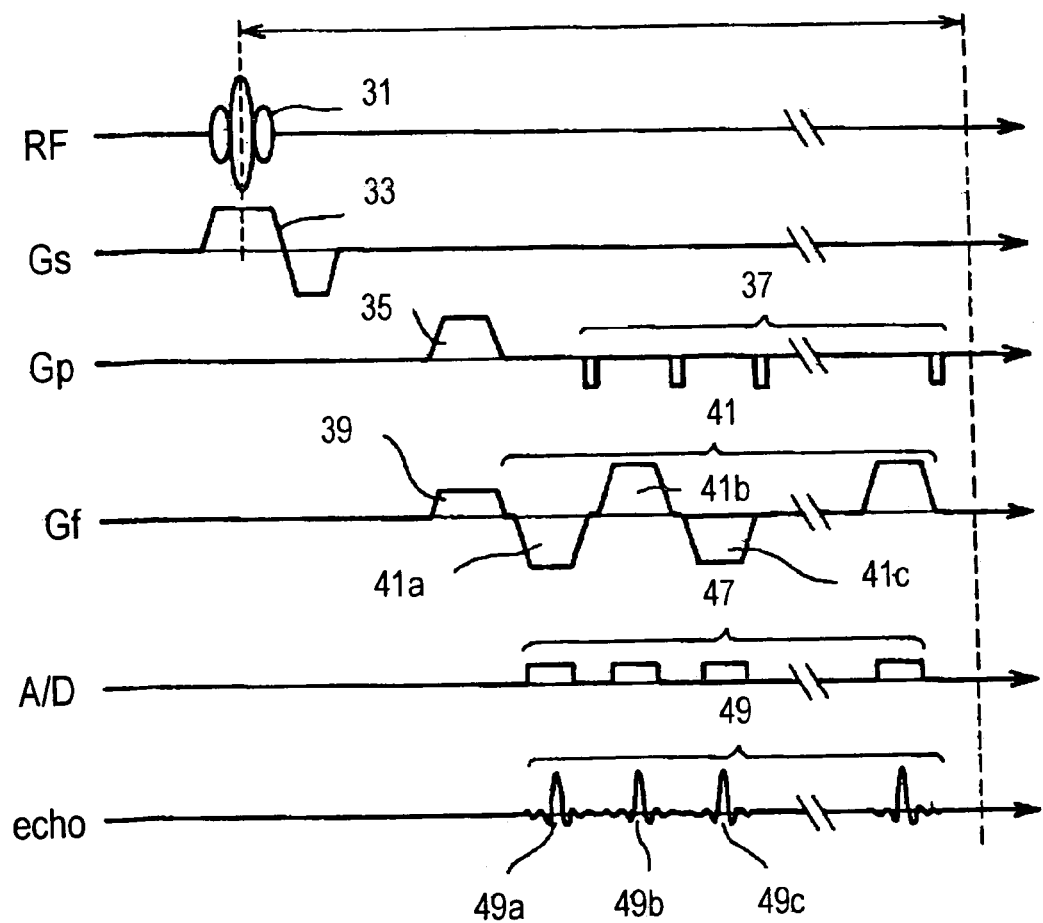
FIG. 3 is a diagram showing an imaging sequence of actual measurement according to the first embodiment of the present invention.
Figure 4:
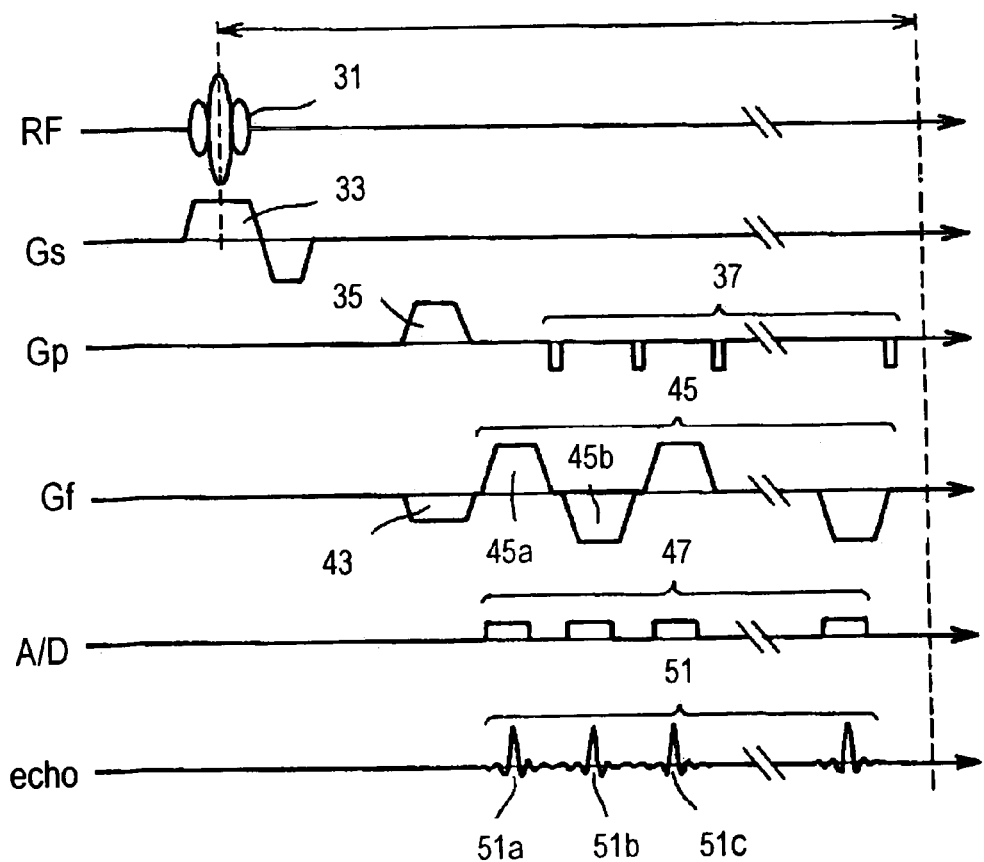
FIG. 4 is a diagram showing an imaging sequence of reference measurement according to the first embodiment of the present invention.

Hereinafter, an embodiment of the present invention will be described with reference to the drawings. FIG. 1 is a diagram showing the procedure of signal processing according to the first embodiment, FIG. 2 is a block diagram showing the schematic structure of a magnetic resonance imaging apparatus, FIG. 3 is a diagram showing an imaging sequence of actual measurement according to the first embodiment, and FIG. 4 is a diagram showing an imaging sequence of reference measurement according to the first embodiment.

Figure 2:
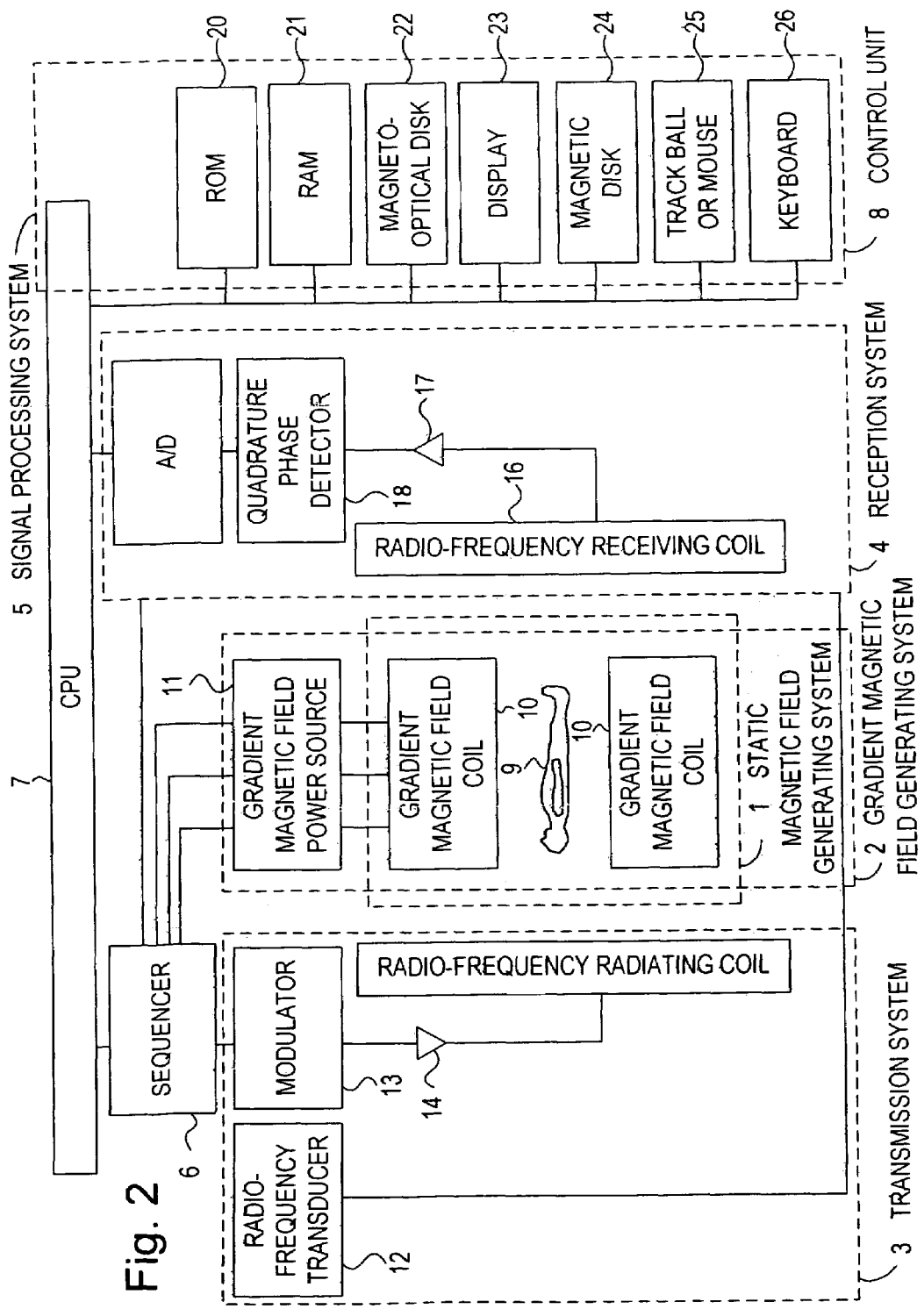
FIG. 2 is a block diagram showing the schematic construction of a magnetic resonance imaging apparatus according to one embodiment of the present invention.

As shown in FIG. 2, a magnetic resonance imaging apparatus includes a static magnetic field generating circuit 1, a gradient magnetic field generating system 2, a transmission system 3, a reception system 4, a signal processing system 5, a sequencer 6, a central processing unit (CPU) 7, and a control unit 8. The static magnetic field generating circuit 1 is designed to generate a uniform static magnetic field to the space into which an object 9 to be examined is inserted. The direction of the static magnetic field usually coincides with the longitudinal direction of the object 9 or the direction perpendicular to the longitudinal direction. Furthermore, the static magnetic field generating circuit 1 is in a permanent magnet type, or a resistive magnet type, or a superconductive magnet type. The gradient magnetic field generating system 2 includes a gradient magnetic field coil 10 which generates gradient magnetic fields in three-axis (X, Y, Z) directions perpendicular to one another and a gradient magnetic field power source 11 for supplying driving current of the gradient magnetic field coil 10. The gradient magnetic field power source 11 is designed to apply to the object 9 the gradient magnetic fields Gs, Gp, and Gr respectively in the orthogonal three-axis (X, Y, Z) directions in accordance with the command of the sequencer 6, and it can set a slicing plane of a tomogram by changing the manner of application of the gradient magnetic fields. The sequencer 6 is activated under the control of the CPU 7, and according to an imaging sequence referred to as a pulse sequence transmits command to the gradient magnetic field generating system 2, the transmission system 3, and the reception system 4, and thus executes the control necessary for obtaining a tomogram.

The transmission system 3 is designed to radiate a radio-frequency magnetic field pulse so as to generate nuclear magnetic resonance to atomic nuclei which form anatomy of the object 9, including a radio-frequency transducer 12, a modulator 13, a radio-frequency amplifier 14, and a radio-frequency radiating coil 15. In the transmission system 3 the amplitude of the radio-frequency magnetic field pulse output from the radio-frequency transducer 12 is modulated by the pulse modulator 13, amplified by the radio-frequency amplifier 14, and then supplied to the radio-frequency radiating coil 15, and the radio-frequency magnetic field pulse (RF pulse) is radiated to the object 9.

The reception system 4 is designed to detect a magnetic resonance signal such as an echo signal emitted due to nuclear magnetic resonance in the atomic nuclei of the anatomy of the object 9, including a radio-frequency receiving coil 16 for reception, an amplifier 17, a quadrature phase detector 18, and an A/D converter 19. A magnetic resonance signal received by the radio-frequency receiving coil 16 is amplified by the amplifier 17, detected by the quadrature phase detector 18, and converted into a digital signal of measurement data by the A/D converter 19. Two series of measurement data dephased by 90° and sampled by the quadrature phase detector 18 in the timing controlled by the sequencer 6 are transmitted to the signal processing system 5.

The signal processing system 5 includes the CPU 7, ROM 20, RAM 21, a magneto-optical disk 22, a display 23 such as a CRT, and a magnetic disk 24. The CPU 7 is designed to perform image reconstruction processing including the Fourier transformation and correction coefficient calculation on the measurement data input, create a signal strength distribution or an image which has been subjected to predetermined processings of an arbitrary cross-section, and display it as a tomogram on the display 23. The ROM 20 stores a program for performing time-sequential image analysis processing and measurement, and a fixed parameter used for execution thereof. The RAM 21 temporarily stores the measurement parameter used in the previous measurement, echo signals detected by the reception system 4, and an image used for ROI setting, and stores a parameter or the like for setting the ROI. The magneto-optical disk 22 and the magnetic disk 24 store the data of an image reconstructed by the CPU 7. The display 23 images the image data stored in the magneto-optical disk 22 and the magnetic disk 24 and displays the tomogram.

The control unit 8 is designed to input the control information of the processings executed by the signal processing system, including, for example, a trackball or a mouse 25 and a keyboard 26.

With reference to FIG. 1, the details of the first example of data processing and image reconstruction in the thus-constructed magnetic resonance imaging apparatus according to the present invention will be described. An imaging sequence shown in FIG. 3, referred to as a pulse sequence, is executed to obtain an actual measurement echo signal (S1). An imaging sequence shown in FIG. 4 is executed to obtain a reference measurement echo signal (S6). The imaging sequence of FIG. 3 and FIG. 4 is a pulse sequence referred to as the echo planer imaging (EPI) method. Both in FIG. 3 and FIG. 4 are shown in descending order a radio-frequency pulse "RF", a slice-select gradient magnetic field "Gs", a phase-encoding gradient magnetic field "Gp", a readout gradient magnetic field "Gf", a sampling window "A/D", and an echo signal "echo" being a magnetic resonance signal. The ordinate represents strength and the abscissa represents time. By performing this pulse sequence one or several times, the measurement data necessary for image reconstruction are collected in the k space.

Next, the details of the sequences shown in FIG. 3 and FIG. 4 will be described. In FIG. 3, by radiating the radio-frequency magnetic field pulse 31 and applying the slice-select gradient magnetic field pulse 33, a desired portion in an object to be examined is excited. Thus, for example, protons in the object are excited. The Gp pulse 35 for giving an offset of phase encoding and the Gf pulse 39 for giving an offset in the readout direction are applied, the Gf pulse 41a, the polarity of which is alternated, is applied, and thus, an echo signal 49a is obtained. After that, the Gp pulse 37 is discretely applied while the Gf pulses 41b and 41c, the polarities of which are repeatedly inverted, are sequentially applied, so that the second and third echo signals 49b and 49c are obtained. To discretely apply the Gp pulse is to acquire echo signals while the amount of phase encoding is varied so as to obtain image information, the amount of which corresponds to the number of phase encodes of the k space. Furthermore, the purpose of repeatedly applying the Gf pulse with its polarity alternated is to acquire a plurality of echo (gradient echo) signals with one radio-frequency magnetic field pulse 31. The difference between the pulse sequences respectively shown in FIG. 3 and FIG. 4 is the difference in the polarity of the Gf pulse. That is, when the amount of phase encoding is the same, the polarity of the Gf pulse in FIG. 3 and that in FIG. 4 are opposite. For example, the polarities of the Gf pulse 39 in FIG. 3 and of the Gf pulse 43 in FIG. 4, those of the Gf pulse 41a in FIG. 3 and of the Gf pulse 45a in FIG. 4, and those of the Gf pulse 41b in FIG. 3 and of the Gf pulse 45b in FIG. 4 are mutually opposite, respectively. As to the rest, FIG. 3 and FIG. 4 are the same.

In FIG. 1, an actual measurement echo signal h (n, m, t) of S1 and a reference measurement echo signal r (n, m, t) of S6 are respectively Fourier-transformed in the readout direction to obtain actual measurement data h (n, m, x) and reference measurement data r (n, m, x). Here, "m" represents the echo number, "t" represents time, "n" represents the repetition number of pulse sequence, and "x" represents the location in the readout direction. Next, phase error components which generate phase gradient in the readout direction in the real image included in the above actual measurement data h (n, m, x) and the reference measurement data r (n, m, x) are corrected (S4, S9), and the actual measurement data h' (n, m, x) and the reference measurement data r' (n, m, x) after phase correction are obtained (S5, S10). This correction (S4, S9) is a conventional one aimed to give the same amount of phase correction so as to correct phase errors occurring due to nonuniformity of the static magnetic field which is hard to be corrected only by the present embodiment. However, the correction according to this embodiment is not necessarily performed with the phase correction.

The correction methods according to the above conventional technique includes, for example, a method in which, prior to the actual measurement the correction data is acquired while the phase encoding gradient magnetic field is not applied, this correction data and the actual measurement data are respectively subjected to the one-dimensional Fourier transformation in the readout direction, and the phase of the correction data is subtracted from the actual measurement data (Japanese Unexamined Patent Publication. Hei. 5-68674) a method of correcting phase difference between even echo and odd echo of the actual measurement data by applying phase difference between two images created by using only even echoes in each of data acquired in two measurements with different polarity of the readout gradient magnetic field to the phase of an image created by using only even echoes of the actual measurement data ("Single-Shot and Segmented EPI Ghost Artifacts Removal with Two-Dimensional Phase Correct"; Nan-kuei Chen, Alice M. Wyrwicz; Proceedings of International Society for Magnetic Resonance in Medicine, 8, 1713 (2000)), and the like.

Next, complex addition of the actual measurement data h' (n, m, x) and the reference measurement data r' (n, m, x) is performed by using the following formulas (1) and (2) (S11):

$$re[S(n, m, x)] = re[h'(n, m, x)] + re[r'(n, m, x)] \quad (1)$$

$$im[S(n, m, x)] = im[h'(n, m, x)] + im[r'(n, m, x)] \quad (2)$$

Even if there is a linear or non-linear phase error generated during sampling of echo signals, by performing complex addition of the actual measurement data and the reference measurement data obtained by making opposite the polarities of the respective readout gradient magnetic field pulse with the identical phase encode amount, the phase error can be counterbalanced. The data S (n, m, x) obtained by the complex addition is Fourier-transformed in the phase encoding direction (S13), and thus, an image I (x, y) without the N/2 artifact can be made (S14). Here, "y" represents the location in the phase encoding direction.

Figure 5:
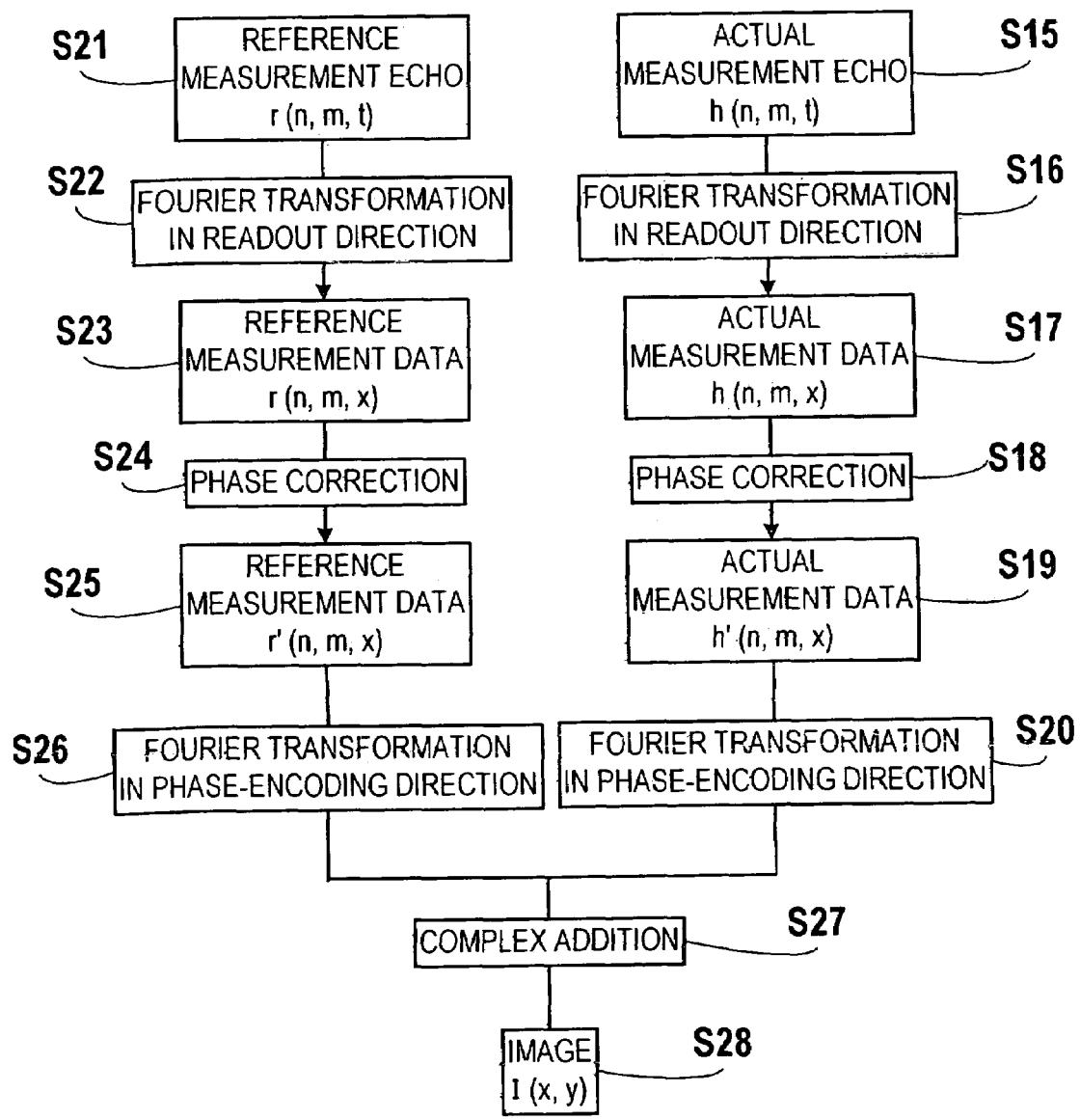
FIG. 5 is a diagram showing the second example of the procedure of signal processing according to the first embodiment of the present invention.

As the second example of data processing and image reconstruction utilizing the present invention, the above complex addition shown in FIG. 5 may be performed after Fourier-transforming the actual measurement data h' (n, m, x) and the reference measurement data r' (n, m, x) after the phase correction, respectively in the phase-encoding direction. Further, as the third example shown in FIG. 6, omitting the correction (S4, S9) the complex addition of the actual measurement data h (n, m, x) and the reference measurement data r (n, m, x) which have been subjected to the Fourier transformation in the readout direction (S2, S7) may be performed. The phase correction (S4, S9) relates to the correction of phase errors occurring due to nonuniformity of the static magnetic field, which is hard to be corrected only by the present embodiment. By performing this phase correction, the image becomes clearer.

Next, referring to FIG. 5, the details of the second example of data processing and imaging reconstruction in the magnetic resonance imaging apparatus using the present invention will be described.

By executing an imaging sequence shown in FIG. 3 referred to as a pulse sequence, an actual measurement echo signal is obtained (S15). By executing an imaging sequence shown in FIG. 4, a reference measurement echo signal is obtained (S21). The actual measurement echo signal h (n, m, t) and the reference measurement echo signal r (n, m, t) are respectively Fourier-transformed in the readout direction to obtain the actual measurement data h (n, m, x) and the reference measurement data r (n, m, x) (S16, S22). Next, phase error components which generate phase gradient in the readout direction in a real image included in the above actual measurement data h (n, m, x) and the reference measurement data r (n, m, x) are corrected (S18, S24) to obtain the actual measurement data h' (n, m, x) and the reference measurement data r' (n, m, x) after the phase correction (S19, S25). The actual measurement data and the reference measurement data are respectively Fourier-transformed in the phase-encoding direction (S20, S26), and in the same manner as in the first example the complex addition is performed (S27), whereby the phase errors are counterbalanced and an image I(x, y) without the N/2 artifact can be created (S28).

Figure 6:
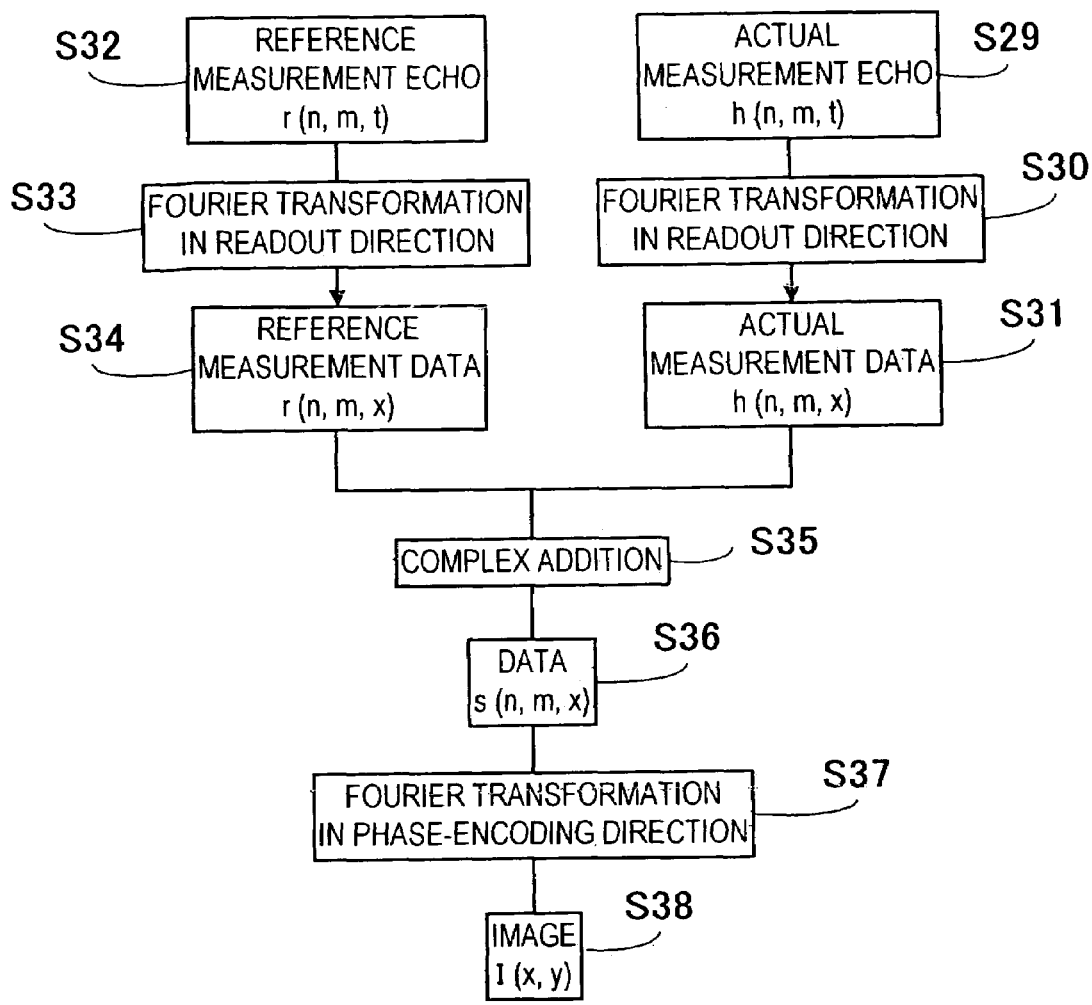
FIG. 6 is a diagram showing the third example of the procedure of signal processing according to the first embodiment of the present invention.

Next, referring to FIG. 6, the details of the third example of data processing and image reconstruction in the magnetic resonance imaging apparatus according to the present invention will be described.

By executing an imaging sequence shown in FIG. 3 referred to as a pulse sequence, an actual measurement echo signal is obtained (S29). By executing an imaging sequence shown in FIG. 4, a reference measurement echo signal is obtained (S32). The actual measurement echo signal h (n, m, t) and the reference measurement echo signal r (n, m, t) are respectively Fourier-transformed in the readout direction to obtain the actual measurement data h (n, m, x) and the reference measurement data r (n, m, x) (S30, S33).

Next, the complex addition of the actual measurement data h (n, m, x) and the reference measurement data r (n, m, x) after the phase correction is performed using the following formulas (3) and (4) (S35):

$$re[S (n, m, x)]=re[h (n, m, x)]+re[r (n, m, x)] \quad (3)$$

$$im[S (n, m, x)]=im[h (n, m, x)]+im[r (n, m, x)] \quad (4)$$

Even if linear or non-linear phase errors are generated during sampling of echo signals, by performing the complex addition of the actual measurement data and the reference measurement data obtained by making opposite the polarities of the respective readout gradient magnetic fields with the identical amount of phase encoding, the phase errors can be counterbalanced. By respectively providing Fourier transformation on the data acquired by the complex addition in the phase encoding direction (S37), an image I(x, y) without the N/2 artifact can be created (S38).

Figure 10:
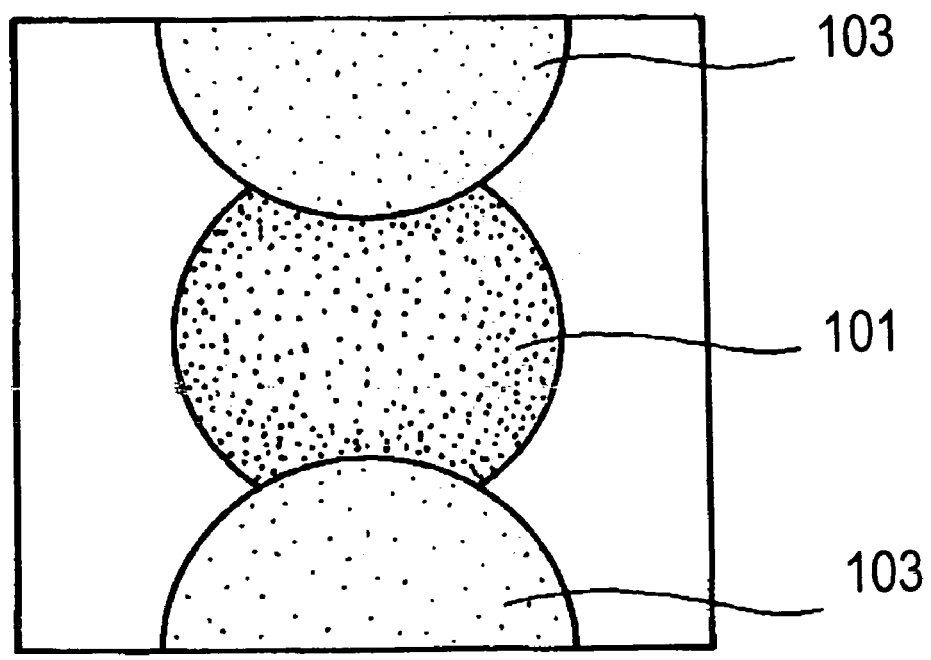
FIG. 10 is a diagram showing appearance of an N/2 artifact.
Figure 11:
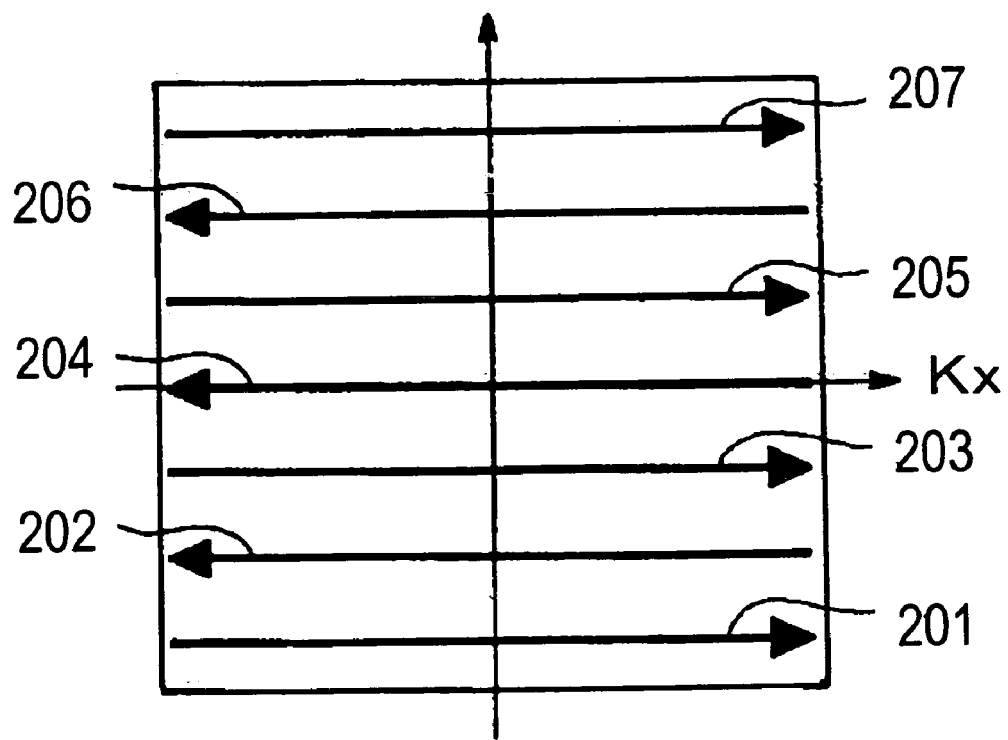
FIG. 11 is a diagram of trajectories of echo signal collection in the k space measured by the EPI pulse sequence.

FIG. 10 is a diagram showing the appearance of the N/b 2 artifact, in which an artifact area 103 appears in an imaging area 101. FIG. 11 is a diagram showing a collection trajectory of echo signals in the k space measured with the EPI pulse sequence. Because the polarity of the readout gradient magnetic field is alternately inverted, the echo signal collection trajectory of the odd echo signals 201, 203, 205, and 207 and that of the even echo signals 202, 204, and 206 are respectively opposite. Because of eddy current and imperfections of the magnetic field occurring due to rapid alternation of the polarity of the gradient magnetic field, phase difference occurs between the even echo signals 202, 204, and 206 and the odd echo signals 201, 203, 205, and 207, and when image reconstruction is performed an N/2 artifact is generated. Image reconstruction and display can be performed suppressing the appearance of the N/2 artifact by counterbalancing the phase difference between the even echo signals and the odd echo signals by performing the above complex addition of S11.

When correction data of phase difference to the actual measurement is acquired in advance and phase correction is performed based on this correction data as in the conventional correction method, because a time interval exists between the time point of acquiring the correction data and that of measurement, the correction is affected by temporal nonuniformity of the static magnetic field nonuniformity based on the time interval. However, according to the present invention, the time interval in data acquisition does not exist since the complex addition of the measurement data of adjoining scans is performed, so that even if the data is temporarily affected by static magnetic field nonuniformity, the influence does not remain in the image.

Figure 7:
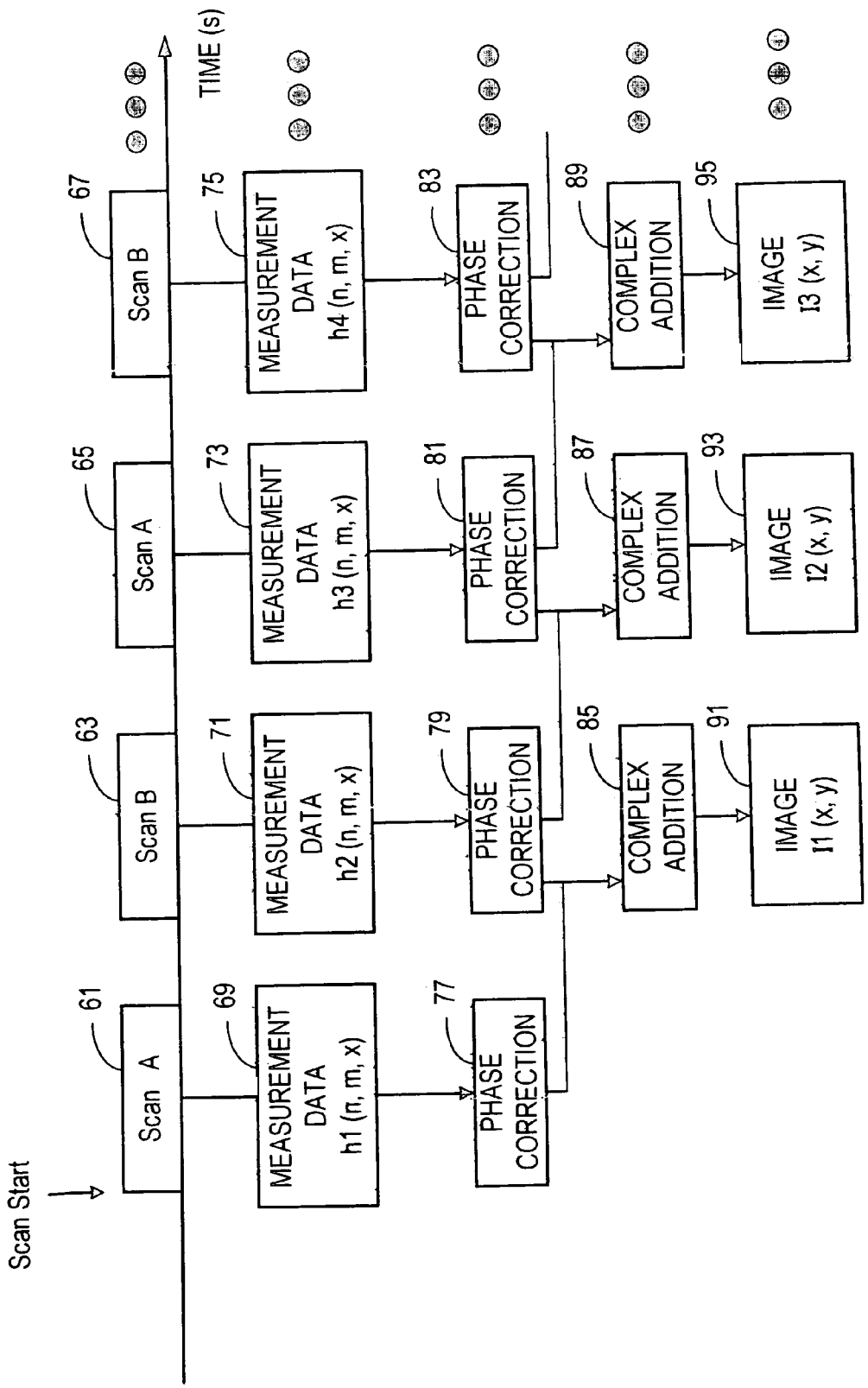
FIG. 7 is a diagram showing the procedure of signal processing according to the second embodiment of the present invention.

Next, data processing in measurement with sequential imaging (hereinafter referred to as "dynamic measurement") according to the second embodiment of the present invention will be described with reference to FIG. 7. FIG. 7 is a schematic diagram showing the procedure of signal processing in the dynamic measurement. Each of Scan A61, Scan B63, Scan A65 and Scan B67 executes a pulse sequence for one image reconstruction, while the order of the polarity of the readout gradient magnetic field in each scan is alternately changed. Complex addition of the data obtained by performing phase correction 77 on the measurement data 69 of Scan A61 and data 79 obtained by performing phase correction on the measurement data 71 of Scan B63 is performed to obtain the image I1 (x, y) 91. Next, complex addition of the data 79 obtained by performing phase correction on measurement data of Scan B63 and the data 81 obtained by performing phase correction on measurement data of Scan A65 is performed to obtain the image I2 (x, y) 93. In a manner similar thereto, the image I3 (x, y) 95 is obtained by performing complex addition of phase-corrected data 81 and 83. In each Scan, since the order of polarity of the readout gradient magnetic field is changed, the polarities of the measurement data acquired in the adjoining scans at the same phase encoding amount are opposite, and even if there exist linear or non-linear phase errors occurring during sampling of echo signals, the phase errors can be counterbalanced by performing complex addition. As a result, the appearance of the N/2 artifact can be suppressed in the image I1 (x, y) 91, the image I2 (x, y) 93, and the image I3 (x, y) 95. Even when imaging is sequentially performed as above, there is no time interval in data acquisition since the complex addition of the measurement data of adjoining scans is performed. Even if the data acquisition is affected by temporal nonuniformity of the static magnetic field, the influence does not remain on the sequentially obtained images.

Although, In FIG. 7, the readout Fourier transformation and the phase-encoding Fourier transformation are performed as in FIG. 1, the description is omitted in the figure. Further, the phase correction 77, 79, 81, and 83 may be omitted as in the first embodiment.

Figure 8:
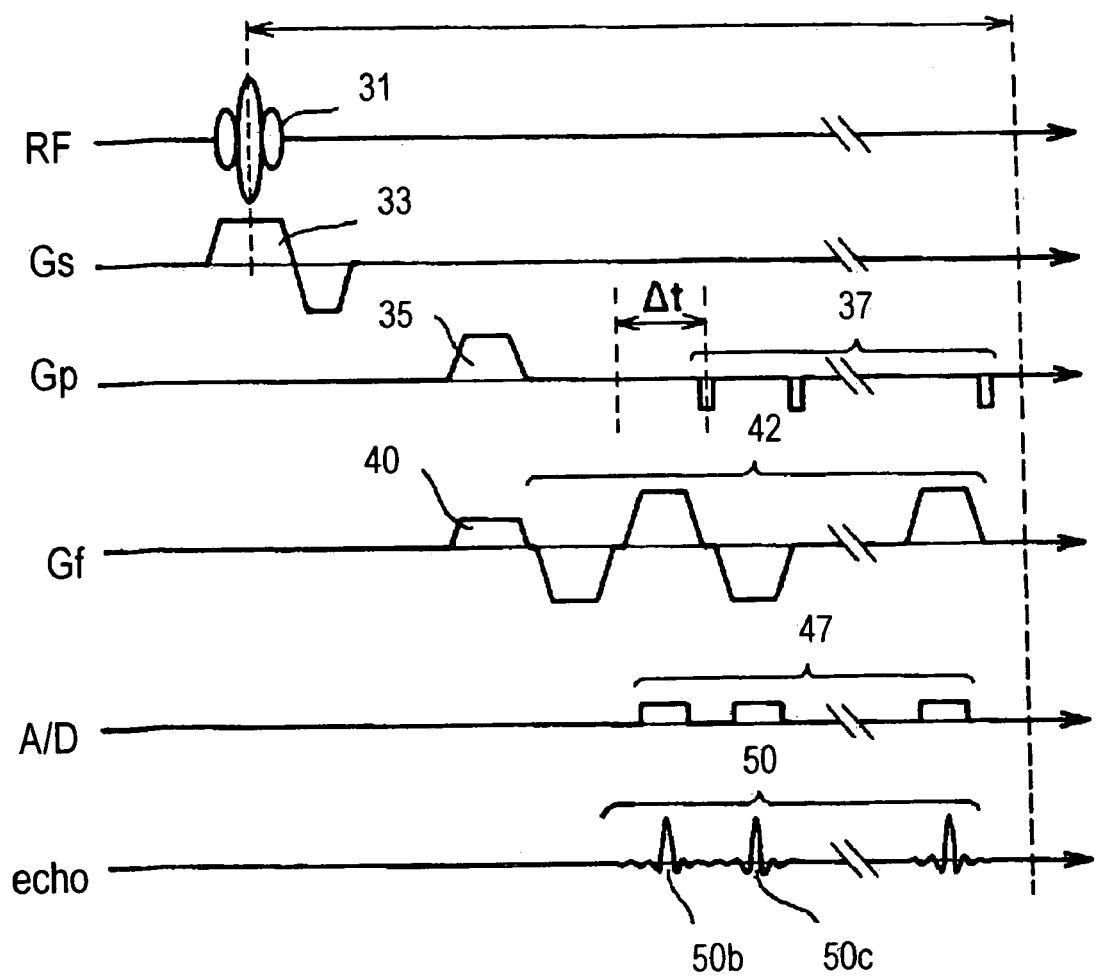
FIG. 8 is a diagram showing an imaging sequence of actual measurement according to the third embodiment of the present invention.
Figure 9:
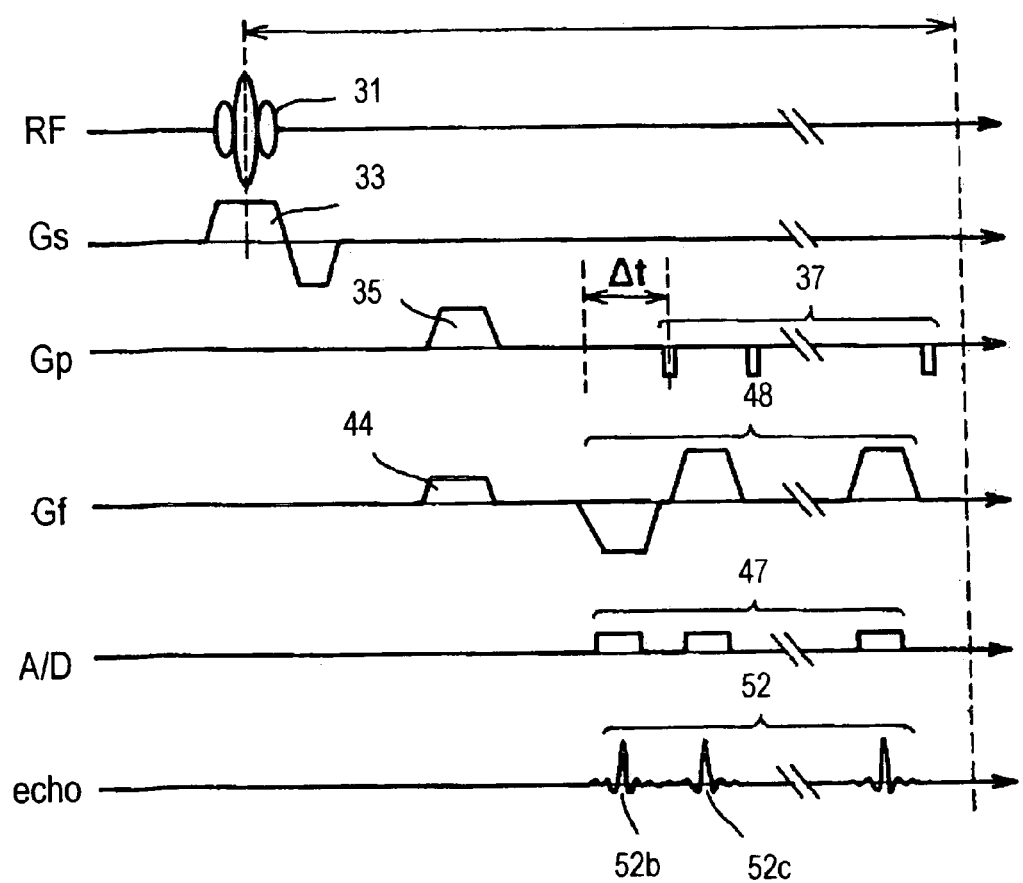
FIG. 9 is a diagram showing an imaging sequence of reference measurement according to the third embodiment of the present invention.

Next, the third embodiment of the present invention will be described with reference to FIG. 8 and FIG. 9. FIG. 8 and FIG. 9 are pulse sequence diagrams. Difference between the pulse sequence shown therein and that according to the first embodiment is that the polarities of Gf pulses 40 and 44 giving an offset in the readout direction are the same. Accordingly, in order to measure two echo signals respectively having opposite polarity of Gf pulse at the same phase encoding amount, in the sequence of FIG. 8 the application timing of the phase-encoding gradient magnetic field pulse 37 is shifted by an echo interval ·t, and the Gf pulse 42 is repeatedly applied while the polarity is normally alternated. At this time, the first echo signal 50a of FIG. 8 is not measured. In FIG. 9, the Gf pulse 48 is applied after a lapse of ·t so that the polarity of Gf pulse 42 is adverse to that in FIG. 8 at the same phase encoding amount. Then, complex addition of the echo signal 50b of FIG. 8 and the echo signal 52b of FIG. 9, and that of the echo signal 50c of FIG. 8 and the echo signal 52c of FIG. 9 are respectively performed to counterbalance the phase errors and succeedingly an image is reconstructed. By shifting the application timing of the phase-encoding gradient magnetic field pulse by the echo interval ·t, flexibility of application of the phase-encoding gradient magnetic field expands, and an echo signal can be obtained in a desired timing. Further, at this time, because the phase errors occurring due to nonuniformity of the static magnetic field are corrected and a clearer image can be obtained, it is desirable to perform the phase correction before the complex addition.

The invention claimed is:

1. A magnetic resonance imaging apparatus varying a phase encoding amount and alternating positive and negative of a readout gradient magnetic field pulse in measurement, comprising:

signal acquisition means for executing a first sequence to acquire a plurality of echo signals by, after radiating a radio-frequency magnetic field pulse to an object to be examined, applying phase encoding and repeatedly applying a readout gradient magnetic field while alternating its polarity, and for executing a second sequence to acquire a plurality of echo signals by, after radiating a radio-frequency pulse to the object, applying phase encoding and repeatedly applying a readout gradient magnetic field while its polarity is alternated oppositely to that in the first sequence at the same phase encoding amount as the first sequence;

transform means for performing Fourier transform in readout direction of both (i) the echo signals obtained by applying the first sequence and (ii) the echo signals obtained by applying the second sequence;

complex addition means for performing complex addition of the Fourier transformed echo signals of the same phase encoding amount respectively obtained in the first sequence and the second sequence, to obtain complexly added data; and image reconstruction means for performing image reconstruction by Fourier transform in phase encoding direction of the complexly added data.

2. A magnetic resonance imaging apparatus according to claim 1, wherein the plurality of echo signals are acquired in every positions in phase encoding direction of the k-space.

3. A magnetic resonance imaging apparatus according to claim 1 or claim 2, wherein the first sequence and the second sequence are alternately repeated, and the image reconstructions means repeatedly reconstructs images.

4. A magnetic resonance imaging apparatus according to claim 1, wherein the complex addition of first measurement data and second measurement data is executed after phase correction.

5. A magnetic resonance imaging apparatus according to claim 1, wherein the first measurement data and the second measurement data include their echo numbers, the repetition numbers of the pulse sequence, and positional information in the readout direction, and are added on the basis of the echo number, the repetition number of the pulse sequence, and the positional information in the readout direction.

6. A magnetic resonance imaging apparatus according to claim 1, wherein, in the first sequence and the second sequence the phase encoding pulse is discretely applied and the phase encoding is changed.

7. The magnetic resonance imaging apparatus according to claim 1, wherein one image is obtained using the result of the complex addition of the k-space data corresponding to the first sequence and the k-space data corresponding to the second sequence.

8. The magnetic resonance imaging apparatus according to claim 1, wherein the complex addition of the k-space data corresponding to the first sequence and the k-space data corresponding to the second sequence removes the N/2 artifact caused by at least one of eddy current and imperfections of the gradient magnetic field in the readout direction.

9. A magnetic resonance imaging method comprising:
(a) executing a first sequence to acquire a plurality of echo signals by, after radiating a radio-frequency magnetic field pulse to an object to be examined, applying phase encoding and repeatedly applying a readout gradient magnetic field while alternating its polarity;
(b) executing a second sequence to acquire a plurality echo signals by, after radiating a radio-frequency pulse to the object, applying phase encoding and repeatedly applying a readout gradient magnetic field while its polarity is altered oppositely to that in the first sequence at the same phase encoding amount as the first sequence;
(c) performing Fourier transform in readout direction of both the echo signals obtained by applying the first sequence and the echo signals obtained by applying the second sequence;
(d) performing complex addition of the Fourier transformed echo signal of the same phase encoding amount respectively obtained in the first sequence and the second sequence, to obtain complexly added data; and
(e) performing image reconstruction by Fourier transform in phase encoding direction of the complexly added data.

10. A magnetic resonance imaging method according to claim 9, further comprising:
performing between step (c) and step (d) a phase correction of the Fourier transformed data in the readout direction.

11. A magnetic resonance imaging method comprising:
(a) executing a first sequence to acquire a plurality of echo signals by, after radiating a radio-frequency magnetic field pulse to an object to be examined, applying phase encoding and repeatedly applying a readout gradient magnetic field while alternating its polarity;
(b) executing a second sequence to acquire a plurality of echo signals by, after radiating a radio-frequency pulse to the object, applying phase encoding and repeatedly applying a readout gradient magnetic field while its polarity is altered oppositely to that in the first sequence at the same phase encoding amount as the first sequence;
(c) performing Fourier transform in readout direction of both the echo signals obtained by applying the first sequence and the echo signals obtained by applying the second sequence;
(d) performing complex addition of the Fourier transformed echo signals of the same phase encoding amount obtained in the first sequence and the second sequence, respectively, to obtain complexly added data, and performing image reconstruction by Fourier transform in phase encoding direction of the complexly added data, to remove the N/2 artifact caused by eddy current or imperfections of the gradient magnetic field in the readout direction by using the phase character of the measurement data between the first sequence and the second sequence.

* * * * *